United States Patent [19]

Bauer

[11] 4,227,254
[45] Oct. 7, 1980

[54] QUASI-ANALOG CHANNEL INDICATOR FOR RADIO RECEIVERS

[75] Inventor: Alfred Bauer, Neu-Isenburg, Fed. Rep. of Germany

[73] Assignee: Braun Aktiengesellschaft, Frankfurt am Main, Fed. Rep. of Germany

[21] Appl. No.: 811,484

[22] Filed: Jun. 30, 1977

[30] Foreign Application Priority Data

Jul. 1, 1976 [DE] Fed. Rep. of Germany ....... 2629606

[51] Int. Cl.³ .......................... H04B 1/16; H03J 1/02
[52] U.S. Cl. ..................................... 455/154; 455/183; 334/86
[58] Field of Search ....................... 116/241, 242, 243; 334/36, 86; 340/324 R, 324 M; 455/154, 157, 159, 183; 358/192.1

[56] References Cited

U.S. PATENT DOCUMENTS

| | | | |
|---|---|---|---|
| 3,882,399 | 5/1975 | Karpowycz et al. ................ | 325/455 |
| 3,898,642 | 8/1975 | Dorey et al. ..................... | 340/324 R |
| 3,961,261 | 6/1976 | Pflasterer ............................ | 325/470 |
| 3,962,641 | 6/1976 | Suwa .................................... | 325/455 |
| 4,009,440 | 2/1977 | Okada et al. ......................... | 325/470 |
| 4,039,956 | 8/1977 | Shimanek et al. ................... | 325/455 |
| 4,040,719 | 8/1977 | Schiebelhuth ....................... | 325/455 |
| 4,048,570 | 9/1977 | Sumi .................................... | 325/459 |
| 4,122,395 | 10/1978 | Schotz et al. ....................... | 325/455 |

*Primary Examiner*—Jin F. Ng
*Attorney, Agent, or Firm*—Michael J. Striker

[57] ABSTRACT

A radio receiver receives a transmitted high-frequency signal which is mixed within the receiver with a local-oscillator-frequency signal to form an intermediate-frequency signal, which in turn is converted into an audio-frequency signal. A plurality of indicator elements are arranged in a row to form a quasi-analog channel indicator, each indicator element of which is associated with a respective one of the selectable channels. A multi-channel oscillator furnishes the requisite local-oscillator-frequency signals for tuning-in the available channels and furthermore controls the operation of the indicator elements of the quasi-analog channel indicator.

3 Claims, 9 Drawing Figures

QUASI-ANALOG CHANNEL INDICATOR FOR RADIO RECEIVERS

BACKGROUND OF THE INVENTION

The invention relates to channel indicators for radio receivers of the type which receive a high-frequency signal which is mixed with an oscillator frequency generated in the radio receiver, the difference frequency between the high frequency and the oscillator frequency in the resultant frequency spectrum being processed further.

In general, radio receivers are provided with an indicator panel on which are indicated the names of a series of transmitting stations or their frequencies, usually referred to simply as "channels". Such an indicator panel is utilized to help tune in a desired channel or to indicate which channel has just been tuned in. Conventional indicator panels are comprised of a scale across which an indicator pointer can be moved by rotating a turning knob. The position which the pointer occupies at any given time indicates which channel has been selected. The movement of the indicator pointer is coordinated with the tuning mechanism of the receiver, so that the pointer moves as the frequency to which the receiver is tuned is being adjusted.

Besides this extremely well known, purely analog type of channel indicator, increasing use has lately been made of digital channel indicators. In these, the numerical value of the frequency of the selected channel is digitally displayed on an indicator. This permits the user to see with a glance the exact frequency of the selected station.

A disadvantage of this more recent, purely digital type of channel indicator is that it does not provide the user with an immediately and sufficiently clear indication of which channel has been selected, because the digitally displayed frequency value cannot be interpreted without knowing the correlation between the available stations (e.g., their call letters) and their exact frequencies. The average user of a radio receiver cannot be expected to remember the frequencies of all channels in his area, or even the frequencies of those stations to which he will most often tune in. In contrast, with the more usual analog-type station indicators, the user is able to determine what station has been selected merely from the spatial position of the indicator pointer.

The relationship between pointer position and channel is particularly simple in, for example, European ultrashortwave radio transmission, because station frequencies are uniformly spaced apart at intervals of 100 KHz.

The wavelength range of ultrashort radio waves extends from 1 to 10 meters, corresponding to a frequency range extending from 300 down to 30 MHz. This range was subdivided into bands allocated to different practical uses, by the 1947 Atlantic City World Communications Conference. Today, in the Federal Republic of Germany, for example, the 3-meter band (90-MHz band), extending from 3.0 meters to 3.43 meters and from 100 MHz to 87.7 MHz, is utilized for radio broadcast purposes. The frequency spacing between ultrashort-wave transmitters was at first set at 400 kHz, and after July 1, 1953 at 300 kHz. After Sept. 1, 1962, the frequency spacing was reduced to 100 kHz. This progressive decrease in inter-station frequency spacing was in part predicated upon the limited transmission range of ultrashort waves. The allocation of frequencies to broadcast transmitters takes into account their transmission ranges and their distances from one another. Broadcast transmitters not located far enough from one another to preclude interference are, as before, assigned frequencies spaced apart by frequency intervals of 300 kHz. The original denomination of transmitting stations by means of channel numbers has been retained; however, the additional stations newly introduced at frequencies 100 kHz below and 100 kHz above each original station are denominated by the same channel number as the original station, but with the addition of a "+" or a "−". Hereinafter, the channels spaced apart by frequency intervals of 300 kHz are referred to as "main channels", whereas the more recently introduced intermediate channel associated therewith are referred to as "left side channels" and "right side channels".

Thus, for some time now, the frequency spacing between adjoining stations in the ultrashort-wave range has been constant. In contrast, until quite recently, similarly regular relationships have not characterized the long-wave and medium-wave radio transmission ranges.

However, the new wavelength-distribution plan of Nov. 22, 1975, established for Europe, Africa, Asia and Oceania now provides for greater uniformity in the frequency spacing of broadcast transmitters. This new allocation system provides that the medium-wave range be subdivided into 120 channels having an interchannel spacing of 9 kHz, and that the long-wave range be divided into 15 channels likewise having an interchannel spacing of 9 kHz (cf. "Funkschau," 1974, vol. 17, p. 655). Thus, uniform interchannel spacings will characterize not only the ultrashort-wave range, but the medium-wave and long-wave ranges as well, the interchannel spacing for the medium- and long-wave ranges now being 9 kHz and for the ultrashort-wave range 100 kHz.

As a result of this new allocation, the use of analog channel indicators begins to offer considerable advantages relative to digital channel indicators, inasmuch as non-linearities in interchannel spacing have been eliminated.

In view of the above, it would appear to be particularly advantageous to provide a radio-receiver channel indicator having the characteristics of analog channel indicators, in order to provide a simple visual overview of channel selection, but also having the characteristics of digital channel indicators, for the sake of precision.

It has already been proposed ("Radio Mentor," vol. 10, 1971, p. 605) to provide a channel indicator comprised of a light-emitting-diode scale. That indicator included a row of 16 light-emitting diodes, of which only one is illuminated at any given time, the position of the illuminated diode indicating the frequency to which the receiver is tuned.

It has also been proposed ("Elektor," April 1973, p. 21) to provide another radio receiver with an electronic front panel, likewise comprised of light-emitting diodes which indicate the selected frequency. In this proposal, the individual light-emitting diodes are switched on and off in coordination with the application of tuning voltages to a varactor tuner.

It is also known (U.S. Pat. No. 3,898,642) to provide an analog indicator arrangement which is controlled by digital signals. This arrangement includes a plurality of light-emitting elements arranged in a row. However, this arrangement is intended primarily for the indication of electrical voltages, and the like, and cannot be readily incorporated into a radio receiver for channel indication purposes.

German Offenlegungsschrift DT-OS No. 2,435,088 discloses a frequency indicator for radio receivers of the type in which the tuned frequency is adjusted using a voltage-dependent impedances. The frequency indicator comprises A.C.-operated and digitally controllable liquid-crystal elements which are arranged in the form of a scale.

The disadvantage of all these known pointwise channel indicators is that they are based upon circuit concepts which lead to a relatively high degree of inaccuracy or imprecision and are furthermore very susceptible to drift phenomena. Quarz-crystal precision and stability cannot be achieved using the circuit concepts of these known indicator arrangements.

It has also been proposed ("Radio-TV-Electronics," 1973, No. 8, "Revox A 700") to provide a digitally controlled channel-frequency indicator comprising a frequency synthesizer. With this proposed system, the control of the "program counter" of the system is effected using diode matrices for the MHz and kHz frequency settings. These matrices simultaneously serve to control the operation of a 5-place nixie-tube channel-frequency indicator. When this indicator is used to provide a numerical channel-frequency indication, the advantages inherent in analog indicators and described above are lost. Additionally, the circuit concepts underlying this proposed system involve considerable additional expense for code converters and for the means for establishing proper resolution for the channel-frequency settings (medium-wave and long-wave).

Frequency synthesizers are in themselves well known (see for example "Funkschau," 1973, vol. 3, pp. 85–87); and German Offenlegungsschriften Nos. 2,328,011; 2,142,779; 2,164,175; 2,123,736; 2,237,824; 2,217,002; 2,441,809 and 2,122,658). In the simplest case, they comprise an oscillator tunable by means of a D.C. voltage. The oscillator furnishes an A.C. voltage in the range of the desired output frequencies. A frequency divider frequency-divides the oscillator voltage and then applies it to a phase-comparison circuit and also to a low-pass filter, through the intermediary of which the output voltage of the phase-comparison circuit is fed back to the oscillator. Accordingly, a frequency synthesizer operates as a phase-coupled device for the various frequencies (phased-locked loop), and makes it possible to derive a large number of tuning frequencies from only a single quarz-crystal-stabilized frequency (cf. "Funkschau," 1973, vol. 9, pp. 325–327; vol. 10, pp. 361–364; "Funkschau," 1974, vol. 2, pp. 62–63; vol. 3, pp. 93–95; "Funkschau," 1974, vol. 6, pp. 177–180).

SUMMARY OF THE INVENTION

It is a general object of the invention to provide a superheterodyne-receiver channel indicator for the ultrashort-, medium- and long-wave ranges comprised of controllable light-emitting elements controlled by circuit components which are simultaneously operative for the generation of the requisite intermediate-frequency signals.

According to one concept of the invention, a plurality of light-emitting elements are provided for indicating selected channels, with each element being associated with a certain channel, the control of the light-emitting elements being performed by a multi-channel oscillator which simultaneously serves to generate the requisite local-oscillator frequencies associated with the respective channels.

The channel indication which the present invention affords is very easy to visually monitor and is achieved using relatively simple means. Additionally, when a frequency synthesizer is utilized, very high indicating accuracy and precision are achieved, and any tendency of the oscillator of the receiver to drift is counteracted.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1:
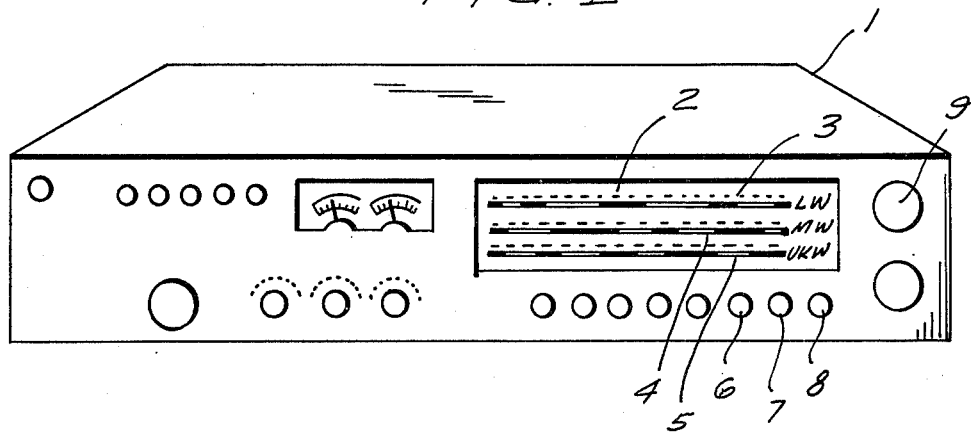
FIG. 1 depicts a radio receiver provided with three rows of light-emitting elements for indicating channel frequencies in three different wavelength ranges.

FIG. 1 depicts a radio receiver 1 provided with a scale 2 for channel indication. The scale 2 is comprised of three rows 3, 4, 5 of light-emitting elements, the upper row 3 being associated with long-wave channels (LW), the middle row 4 with medium-wave channels (MW), and the bottom row 5 with ultrashort-wave channels (UKW). To tune in a channel within one of the three ranges, one first presses a respective one of the wavelength-range buttons 6, 7, 8 and then turns a tuning knob 9; when this is done, the light-emitting elements in the corresponding row light up one after the other as the tuning frequency is being adjusted.

Figure 2:
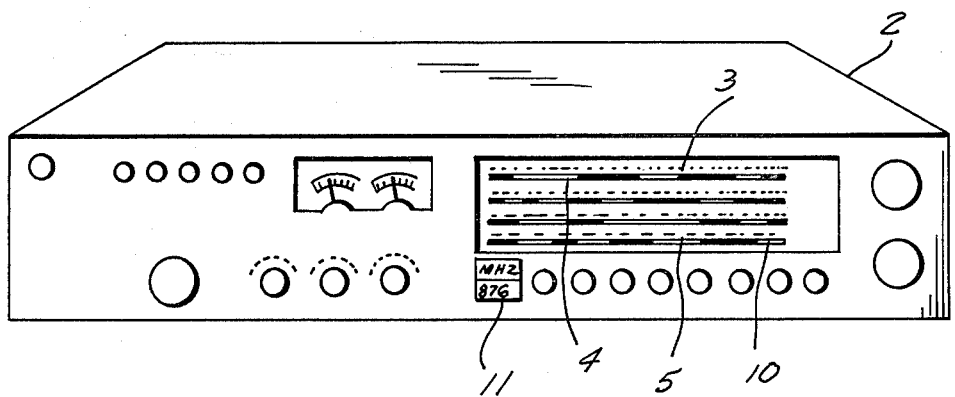
FIG. 2 depicts a radio receiver provided with four rows of light-emitting elements, and also provided with an alphanumeric display for channel-frequency indication.

FIG. 2 depicts a radio receiver 2 whose channel indicator comprises four rows 3, 4, 5, 10 of light-emitting elements, i.e. including an additional row 10 for the indication of channels in the short-wave range (KW). Also, the receiver 2 of FIG. 2 is furthermore provided with an alphanumeric channel indicator 11.

The light-emitting elements in question are preferably light-emitting diodes or liquid-crystal elements; in the latter case, the liquid-crystal elements could be used alone or in cooperation with a light source. The expression light-emitting elements, as used herein, encompasses the preferred possibilities of LED's and liquid-crystal elements cooperating with a light source, but also encompasses, for example, the possibility of using liquid-crystal elements without cooperating light source.

Figure 3:
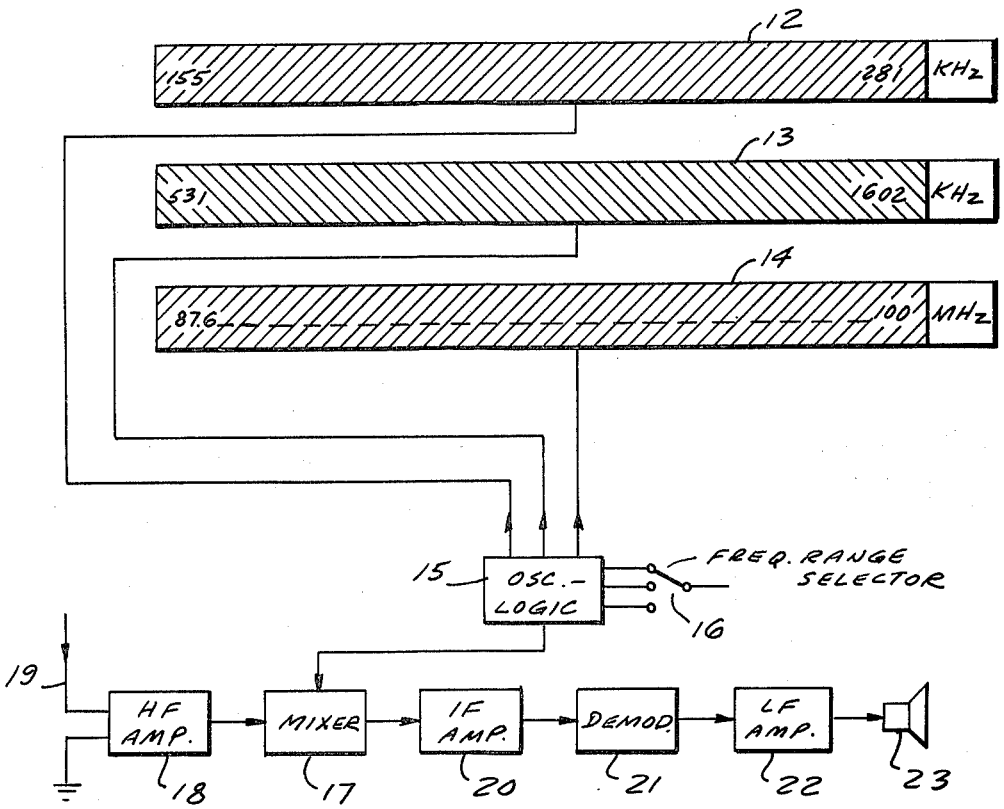
FIG. 3 is a simplified schematic circuit showing the manner in which one can control three rows of light-emitting elements provided for the indication of long-, medium- and ultrashort-wave channels.

FIG. 3 is a simplified schematic circuit diagram illustrating the basic control concepts for three frequency ranges. Numerals 12, 13 and 14 respectively denote the rows of light-emitting elements for the long-wave range, the medium-wave range and the ultrashort-wave range of channel frequencies. All three frequency rows 12, 13, 14 are connected with an oscillator-logic unit 15 which can be set to different frequencies by means of a changeover unit 16.

The oscillator-logic unit 15 is connected to a mixer stage 17 which receives a high-frequency radio signal from a high-frequency amplifier 18, which in turn receives such signal from an antenna 19. The output of mixer stage 17 is connected to the input of an intermediate-frequency amplifier 20, in turn connected to an IF demodulator 21, in turn connected to a low-frequency amplifier 22 which drives a speaker 23.

Figure 4:
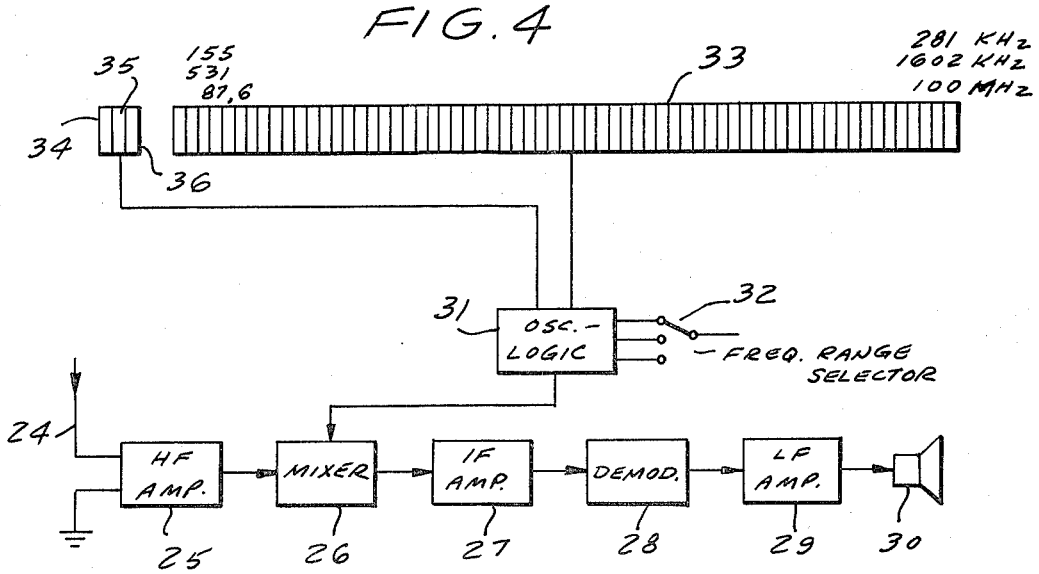
FIG. 4 is a simplified schematic circuit showing the manner in which one can control a single row of light-emitting elements and indicate channel frequencies in three wavelength ranges utilizing a changeover circuit.

FIG. 4 is a simplified schematic circuit diagram illustrating how a single row of indicating elements can be controlled for indicating channels in a plurality of frequency ranges. As in FIG. 3, the circuit includes an antenna 24, an HF amplifier 25, a mixer stage 26, an IF amplifier 27, an IF demodulator 28, an LF amplifier 29 and a speaker 30, the mixer stage 26 being connected to an oscillator-logic unit 31. The unit 31 is provided with a range-changeover unit 32. Oscillator-logic unit 31 controls the operation of the channel indicator 33 in dependence upon the setting of the range-changeover unit 32.

In addition to the light-emitting elements of the channel indicator 33, three further light-emitting elements 34, 35, 36 are provided, also controlled by the oscillator-logic unit 31.

The channel indicator 33 includes a total of sixty-four light-emitting elements. Thus, for FM, the indicator 33 can indicate main channels #2 through #65. The medium-wave frequency range includes one hundred and twenty channels. When varactors are employed for tuning in this range, this range must anyway be divided into two component ranges, MW1 (channels 0 through #64) and MW2 (channels #65 through #124). This range subdivision can be established by means of the range-changeover unit 32.

For the long-wave frequency range, the oscillator frequency is tripled, in order to triple the resolution from 9 kHz/3 kHz to 3 kHz/1 kHz. Accordingly, 43 indications are required for the long-wave range, in a range from 155 kHz to 281 kHz. If the channel indicator 33 is to be set up for uniform indication in this range, the long-wave range extends through to 344 kHz, i.e., to the end of the usual long-wave band.

For ultrashort-wave reception, the left and right side channels (defined earlier) can be indicated by means of the additional light-emitting elements 34, 35, 36. If the middle element 35 lights up together with one of the elements of indicator 33, this means that a main channel (defined earlier) has been tuned in. If the left element 34 lights up together with one of the elements of indicator 33, this means that a left side channel has been tuned in. If the right element 36 lights up together with one of the elements of indicator 33, this means that a right side channel has been tuned in.

Instead of three auxiliary light-emitting elements 34, 35, 36, it would suffice to use only two. In that event, the tuning-in of a main channel would be indicated by the fact that only one of the elements of indicator 33 is lit up, whereas when a side channel is tuned in one of the two auxiliary elements would be lit up in addition.

Accordingly, the arrangement illustrated in FIG. 4 makes it possible to digitally tune in and indicate in quasi-analog manner all FM channels and also three AM ranges.

Figure 5:
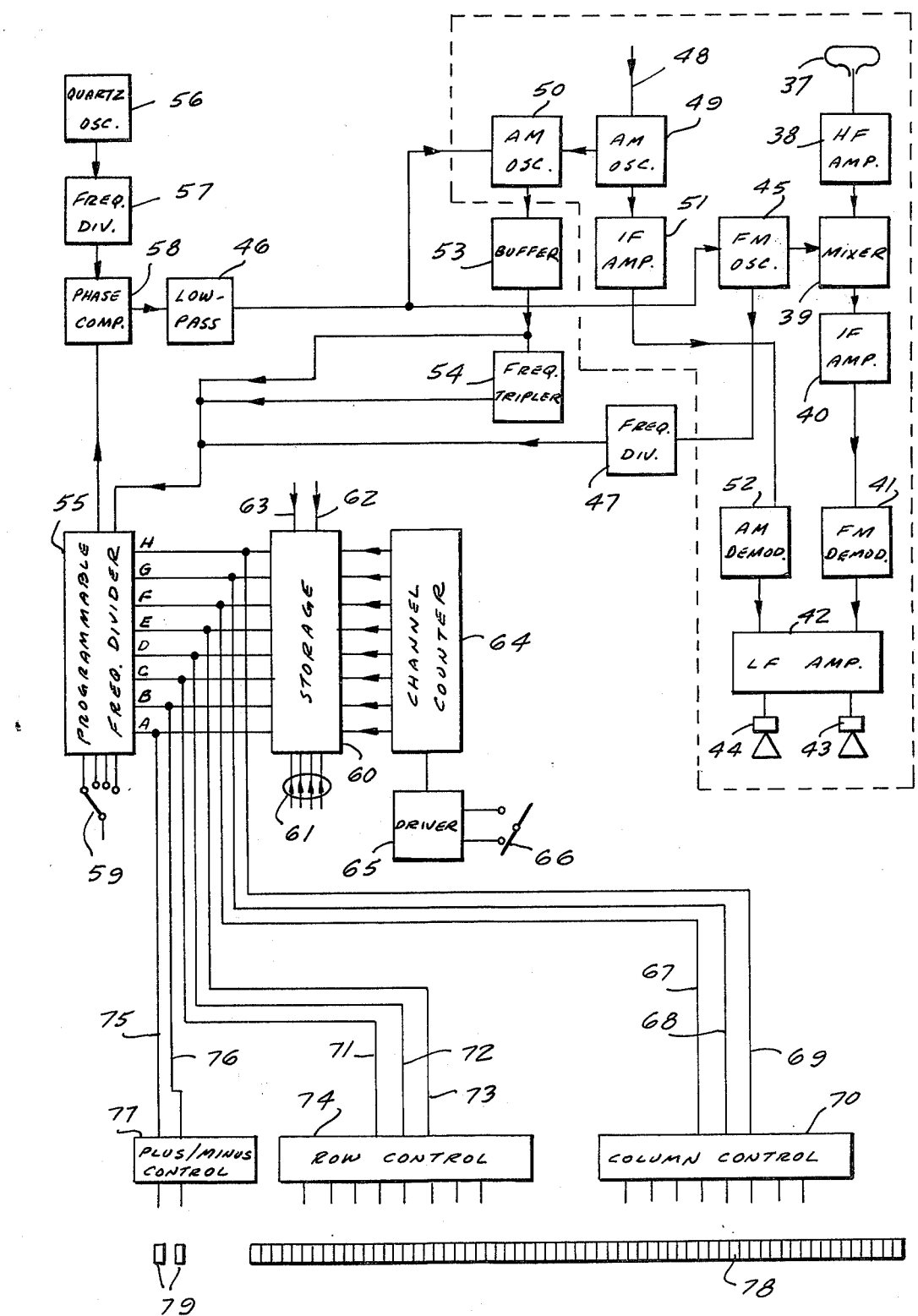
FIG. 5 is a detailed schematic block circuit diagram of the arrangement shown in FIG. 4.

FIG. 5 depicts a circuit of the type shown in FIG. 4, in greater detail. Those circuit components conventional in an AM/FM radio receiver are shown enclosed in broken lines.

Numeral 37 denotes an antenna connected to the input of an HF preamplifier stage 39. Connected to the output of the latter is an FM mixer stage 38, which in turn leads to an FM intermediate-frequency amplifier 40. The output signal of the latter is applied to an FM demodulator 41, whose output signal is applied to a LF amplifier 42. The latter drives speakers 43, 44.

The FM mixer stage 39 is connected to an FM oscillator 45. FM oscillator 45 is driven through the intermediary of an active low-pass filter 46 and furnishes control signals to a buffer/frequency-divider stage 47.

The AM circuitry of the receiver of FIG. 5 includes an antenna 48 connected to an AM oscillator 49, in turn connected to a further AM oscillator 50 and to an IF amplifier 51. The output signal of the latter is applied to an AM demodulator 52, which is in turn connected to an LF amplifier 42.

AM oscillator 50 controls a tripler 54 for the long-wave range, through the intermediary of a buffer 53. Additionally, the output signal of buffer 53 is applied to a programmable frequency divider 55, which is also connected to the output of the tripler 54. The programmable frequency divider 55 is also connected to the buffer/frequency-divider unit 47, the latter being controlled by the FM oscillator 45.

A quartz oscillator 56 furnishes a quartz-crystal-stabilized standard frequency, which is of particular importance for the entire indicating system of the invention. This standard frequency is for example 4.5 MHz. Connected to the output of quartz oscillator 56 is a frequency divider 57 which can be set to different frequency-division factors, to provide a 5 kHz standard frequency for FM and a 3 kHz standard frequency for AM. The standard frequency is applied to a charge pump/phase detector 58, which also receives a signal from frequency divider 55. The output signal of stage 58 is applied to the active low-pass filter 46. The standard frequency for MW and LW amounts to 9 kHz÷3=3 kHz, whereas for the ultrashort-wave range (UKW) it amounts to 300 kHz÷3×1/P=5 kHz. P is the frequency-division factor of the frequency divider 47 and is necessary for reducing the input frequency for the ultrashort-wave range, and it amounts to 20. This frequency division is performed using for example an 8-stage binary frequency divider.

The phase comparator 58 compares the phase of the frequency established by divider 55 against that of the standard frequency (5 kHz for FM) and furnishes a corresponding feedback voltage for automatically adjusting the FM oscillator 45. In order to achieve a high tuning speed and simultaneously good suppression of the standard frequency (which is in the LF range), it is preferred to use for the phase comparator 58 a phase comparator of the sampling-circuit-type, with the low-pass filter 46 being connected to the output thereof.

The programmable frequency divider 55 is provided with a range-changeover switch 59 by means of which any one of the four different frequency ranges (UKW, MW1, MW2 and LW) can be selected.

The eights inputs A–H of frequency divider 55 are connected to eight corresponding outputs of a storage 60; storage 60 is preferably a random-access memory (RAM). Storage 60 is provided with four address inputs 61 by means of which four 8-bit storage locations in the storage 60 can be addressed. Storage 60 is also provided with a write-in control line 62 and with a read-out control line 63. The four address inputs 61 could, for example, each be associated with a respective one of four pushbuttons. The write-in control line 62 and the read-out control line 63 could both be associated with a read-write switch normally maintained in its read-out setting. Thus, if the user of the receiver wishes to be able to immediately tune in a certain station (for example a favorite station), he would first tune in that station (in a manner described below). When that station is tuned in, unit 64 applies to the eight inputs of storage 60 an 8-bit code word indicative of that station (and described in greater detail below). Next, the user moves the read-write switch to its write-in setting and then presses one of the four pushbuttons associated with address inputs 61. This would cause the 8-bit code word indicative of the station to be registered in the 8-bit storage location addressed by the selected pushbutton. The user would then release the selected pushbutton, and would also release the read-write control switch which would then automatically return to its normal read-out setting. Thereafter, whenever the user wishes the station in question to be tuned in, he need only press the pushbutton in question to effect read-out of the eight-bit code word identifying that station. Of course, the station in question will be in one of the four available frequency ranges selectable by range-changeover switch 59; therefore, when the stored station is to be manually read out in this way, it is necessary that range-changeover switch 59 be in the setting corresponding to the frequency range of the station of interest.

The eight inputs of storage 60 are connected to eight corresponding outputs of a forward-backward channel counter 64. Channel counter 64 is controlled by a countercontrol stage 65, which in turn is activatable by means of a rocker switch 66.

Eight branch-off lines branch off from respective ones of the eight input lines A–H of programmed frequency divider 55. Three of these lines 67, 68, 69 (branching off lines F, G, H) lead to a column-control stage 70; three lines 71, 72, 73 (branching off lines C, D, E) lead to a row-control stage 74; and two lines 75, 76 (branching off lines A, B) lead to a plus/minus-control stage 77.

The column-control stage 70, the row-control stage 74 and the plus/minus-control stage 77 are interconnected with light-emitting elements 78 and 79 in such a manner that the light emitting elements associated with the selected channnels light up. The interconnections are explained in greater detail below.

The operation of the circuit shown in FIG. 5, to the extent that the conventional AM/FM-receiver components shown enclosed in the broken lines are involved, is familiar to persons skilled in the art, and need not be explained in detail here.

The operation of the remainder of the circuit is as follows:

Discussing first ultrashort-wave reception: The reception range is about 87.7–100 MHz (3.43–3.0 meters) and the intermediate frequency is 10.7 MHz, requiring that the frequency of FM oscillator 45 be adjustable within a range of $f_o = 98.4$ to 110.7 MHz.

The frequency to which FM oscillator 45 is set at any given moment is divided by twenty in frequency divider 47 and applied to the f-input of the programmed frequency divider 55. The frequency divider 55 divides this frequency further, by a factor N dependent upon the frequency of the channel to be tuned in. The reduced frequency furnished by programmed frequency divider 55 is furnished to one input of the phase comparator 58, the other input of which receives the 5 kHz standard frequency. The frequency-difference-dependent signal produced at the output of phase comparator 58 is applied to the input of the active low-pass filter stage 46, and the latter forms at its output a frequency-control signal which is applied to the frequency-control input of oscillator 45. Thus, for ultrashort-wave reception, the frequency to which oscillator 45 is tuned (and therefore the station which will be tuned-in) is determined by the frequency-division factor N introduced by the programmed frequency divider 55.

The selected station having been tuned in, a change to a different station in the ultrashort-wave range requires that the frequency-division factor N introduced by the programmed frequency divider 55 be changed correspondingly, resulting in a corresponding frequency-difference-dependent signal at the output of phase comparator 58, and accordingly a new frequency-control signal at the output of active low-pass filter stage 46.

Because the FM oscillator 45 must have an adjustable frequency in the range of about 98.2–114.7 MHz (i.e., 10.7 MHz higher than the frequency of the received signal), the frequency-division by a factor of twenty effected by divider 47, brings down the frequency of the signal applied to the f-input of programmed frequency divider 55 to a range of about 4.91–5.735 MHz. (The frequency division by this factor of twenty can, for example, be effected first by a factor of four, utilizing for example a double ECL flip-flop, followed by division by a factor of five.)

The frequency-division factor twenty introduced by frequency divider 47 also reduces the standard frequency needed for FM tuning and furnished at the output of frequency divider 57—i.e., the 100 kHz interchannel spacing for FM is brought down by a factor of twenty to 5 kHz, so that a 5 kHz standard frequency can be used for the frequency-control of the FM oscillator 45.

As indicated above, the frequency to which the FM oscillator 45 is tuned is changed by changing the frequency-division factor N introduced into the phase-locked loop by means of the programmed frequency divider 55. The division factor N is determined by the channel-identifying code word applied to inputs A–H of frequency divider 55. Application of each one of the different possible code words to inputs A–H results in the establishment of a different respective frequency-division factor N, and accordingly the automatic adjustment of the frequency of FM oscillator 45 to a different respective one of the required local-oscillator frequencies.

The tuning operation, just described with respect to ultrashort-wave (UKW) reception, is analogous for medium-wave (MW1 and MW2) and long-wave (LW) reception.

Specifically, for long-wave (LW) reception, it is not the FM oscillator 45 whose local frequency is to be adjusted, but instead the local-frequency AM oscillator 50. Thus, for long-wave reception, it is AM oscillator 50 which is switched-in into the phase-coupled loop. The output frequency of AM oscillator 50 is applied, through the intermediary of a buffer 53, directly to the f-input of programmed frequency divider 55—i.e., without being frequency-divided prior to application to the f-input of divider 55. In other respects, the phase-locked-loop tuning action is the same as for ultrashort-wave reception, just described.

For medium-wave (MW1, MW2) reception, it is again the AM oscillator 50 whose local frequency is automatically adjusted by the frequency-control signal at the output of low-pass filter stage 46. However, for MW reception, the frequency of AM oscillator 50 is tripled, by means of tripler 54, prior to application to the f-input of the programmed frequency divider 55.

Thus, for ultrashort-wave (UKW), long-wave (LW) and medium-wave (MW) reception, the local-oscillator frequency (whether of FM oscillator 45 or of AM oscillator 50) is changed within the selected frequency range, by changing the frequency-division factor N introduced into the phase-coupled loop by the programmed frequency divider 55, in dependence upon the binary code word applied to the inputs A–H of frequency divider 55.

However, whereas for ultrashort-wave (UKW) reception, the frequency divider 57 furnishes a standard frequency of 5 kHz, for medium-wave (MW) and long-wave (LW) reception frequency divider 57 is switched over to instead furnish a standard frequency of 3 kHz.

Because programmed frequency divider 55 has eight inputs A–H, sixty-four distinguishable eight-bit channel-identifying code words can be applied thereto. In addition, and as mentioned earlier, programmed frequency divider 55 has a four-setting range-changeover switch 59, whose setting determines which of the four frequency ranges (UKW, MW1, MW2, LW) is to be utilized. With $2^8$ possible channel-identifying code words, the programmed frequency divider 55 has the theoretical capacity of providing $2^8$ different values of the frequency-division factor N for each one of the four frequency ranges.

The correlation between the settings of range-changeover switch 59 and the channel-identifying code words, on the one hand, and the actual value of the frequency-division factor N, on the other hand, is explained as follows:

For ultrashort-wave (UKW) reception, as explained earlier, main channels are spaced at frequency intervals of 300 kHz, and each main channel has associated with it left and right sice channels located 100 kHz below and above the main channel, respectively. For UKW reception, sixty-four ($2^6$) main channels are to be selectable, which would require six of the eight inputs A–H of programmed frequency divider 55. However, inasmuch as each main channel has associated with it two side channels, three times sixty-four different station-identifying code words are required, necessitating all eight of the eight inputs A–H, i.e., to be able to select three times sixty-four different local-oscillator frequencies for FM oscillator 45.

For each of the other three frequency ranges (MW1, MW2, LW), the number of channels to be selectable is smaller than sixty-four, and so in principle only six of the eight inputs A–H of divider 55 need be used for channel-identifying code words. For these three frequency ranges, the superfluous code-word possibilities could be used for tuning-in to frequencies located, for example, 3 kHz below and above each of the actual channels. Otherwise, they could be left unutilized.

The manner in which binary code words are applied to the inputs A–H of programmed frequency divider 55 is as follows:

First, if a storage 60 is provided, then as already explained, depression of one of the four pushbuttons associated with the four address inputs 61 automatically applies to inputs A–H the code word corresponding to the preselected channel; the user must only make sure that the range-changeover switch is set to the frequency range in which the desired channel is located.

More generally, however, the channel-identifying code words are applied to the inputs A–H of divider 55 by means of the forward/backward channel counter 64, already mentioned. To activate channel counter 64, the user moves the rocker switch 66 to the forward setting. As a result, counter control stage 65 drives channel counter 64, and the outputs of counter 64 furnish 8-bit channel-identifying code words in succession at a predetermined rate.

This succession of 8-bit channel-identifying code words is applied to the storage units within storage 60; in general, however, i.e., when "favorite" channels or the like are not being set up for later manual recall, a write-control signal is not applied to write-control input 62, so that the succession of 8-bit channel-identifying code words has no effect upon the storage 60. Instead, each 8-bit channel-identifying code word is transmitted directly through the storage 60 (e.g., through simple by-pass lines) to the inputs A–H of programmed frequency divider 55. As each successive channel-identifying code word is applied to divider 55, the latter introduces a different respective frequency-division factor N into the phase-locked loop, causing the corresponding succession of channels to be tuned in, one after the other. When the channel which the user is seeking has been reached, the user releases the rocker switch 66, and the latter assumes its neutral setting. As a result, the count just reached by channel counter 64 persists indefinitely, and the selected channel remains tuned in. If the user realizes that he has not reached the channel he wanted, he can activate the rocker switch 66 again, to cause further advancement of counter 64 until the desired channel is reached. Likewise, if the user overshoots the desired channel, or changes his mind as to which channel he desires, he then activates rocker switch 66 in the opposite direction, in response to which the forward/backward channel counter 64 will commence to count downward. Thus, using the rocker switch 66, the user is able to tune in desired channels as easily as if he were employing a rotating tuning knob, and more easily if the user is changing from one channel to another channel located at the opposite end of the selected frequency band. More complicated channel counting operations could be employed, if desired; for example, the counter 64 could cease counting after each change of channel, requiring that switch 66 be repeatedly activated; alternatively, the counter might automatically stop counting after each fifth or tenth automatic channel change, etc.

If preselection of "favorite" channels for quick manual recall is not desired, then the storage 60 could be eliminated, and the eight outputs of channel counter 64 connected directly to the inputs A—H of programmed frequency divider 55.

If the preselection storage 60 is to be utilized, then as explained before it can, for example, be comprised of four 8-bit storage units. When the receiver is not in use, i.e., disconnected from power, the retention of the information relating to preselected channels in storage 60 could, if necessary, be supported by means of an auxiliary current source (not illustrated), for example a 3-volt battery capable of maintaining information storage for several weeks.

Figure 6:
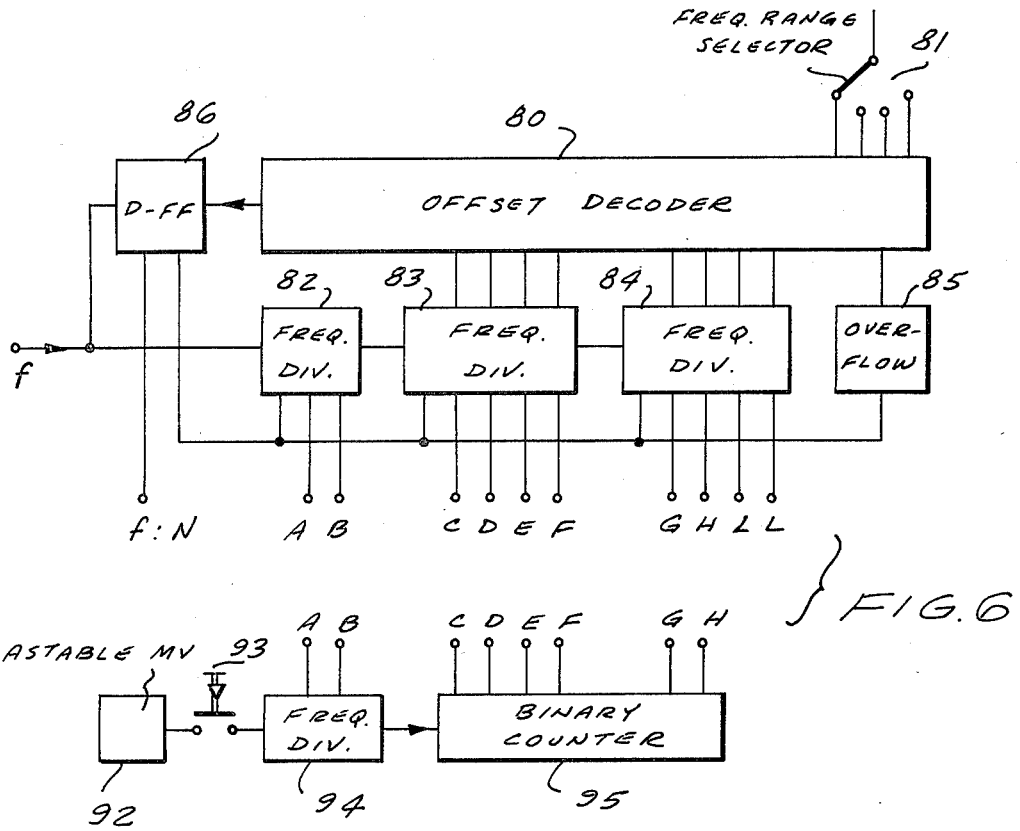
FIG. 6 depicts a programmable frequency divider for a frequency synthesizer.

FIG. 6 schematically depicts in greater detail the construction of a programmed frequency divider such as could be used for the divider 55 of FIG. 5. Such programmed frequency dividers are known in principle (cf. "TTL Integrierte Schaltkreise, Zähler and Teiler der Serie SN 54,74", Texas Instruments Deutschland GmbH, Applicationsbericht, pp. 29–31).

The illustrative programmed divider shown in FIG. 6 includes an offset decoder 80 provided with a range-changeover switch 81. Offset decoder 80 is connected to a first frequency divider 82 operative for establishing a distinction between the tuning-in of main channels and side channels in the UKW range, a second frequency divider 83, a third frequency divider 84, an overflow flip-flop 85, and a D-flip-flop having a clock input at its left side and Q and $\bar{Q}$ lower outputs. The control inputs to the dividers 82, 83, 84 are denoted by A–H, in correspondence to the designations employed in FIG. 5. The input frequency to the divider shown in FIG. 6 is applied to the f-input thereof, in correspondence to what is shown in FIG. 5, and the output frequency, which is equal to the input frequency divided by the factor N, is furnished at the f÷N output thereof.

The frequency-division factor N which the programmed divider introduces is dependent, on the one hand, upon the 8-bit channel-identifying code word applied to inputs A–H, either from a storage such as the storage 60 shown in FIG. 5, or else directly from a forward/backward channel counter such as the counter 64 shown in FIG. 5; additionally, the actual value of the division factor N is of course also dependent upon the permanently-wired offset for each wavelength range—i.e., the offset decoder 80 can be of the permanently-wired type and operative for establishing the requisite offset for each frequency range in dependence upon the range selected by range-changeover switch 81. The required offset is determined, for each frequency range, by the requisite intermediate frequency ($f_z$) and initial frequency ($f_e$). Thus, in the MW1 range (channel #1=$f_e$=531 kHz), the required local-oscillator frequency ($f_o$) for a 459 kHz intermediate frequency ($f_z$) is equal to $f_o = f_e + f_z = 531$ kHz + 459 kHz = 990 kHz. Using a standard frequency $f_r = 3$ kHz, the required frequency-division ratio (offset) is $N_{min} = 990$ kHz/3 kHz. This offset $N_{min}$ is permanently wired-in for the MW1 range. Similar remarks apply to the other three frequency ranges.

To facilitate understanding of the programmed frequency divider of FIG. 6, FIG. 6 additionally depicts a channel counter comprised of an astable multivibrator 92, an activating button 93, a frequency divider 94, and a 6-bit binary counter 95. As mentioned before, a storage such as the storage 60 of FIG. 5 need not be employed, and the 8-bit channel-identifying code word could be supplied directly from the outputs of the channel counter.

When button 93 is activated, the pulses generated by astable multivibrator 92 are divided, in divider 94, first by a factor of 3; i.e., frequency divider 94 furnishes a pulse to counter 95 after each third pulse received from multivibrator 92. Frequency divider 94 accordingly operates much like a counter which counts up to three and then starts over. Accordingly, the signals at outputs A, B of divider 94 assume the following states in succession: 01, 10, 11; combination 01 is associated with the left side channel, combination 11 with the right side channel, and combination 10 with the main channel. The pulses furnished at the output of divider 94 are applied to the input of counter 95, and the latter counts up to sixty-four and then recommences counting. If during count-up by counter 95 the activating button 93 is released, then count-up stops, and whatever count has been reached on the outputs of binary counter 95 persists.

Accordingly, outputs A, B of divider 94 furnish information distinguishing among main and side channels, whereas outputs C–H of counter 95 furnish information concerning channel number, in coded form. If a storage such as storage 60 in FIG. 5 is employed, then this 8-bit channel-identifying code word can be stored for later manual recall, in the manner already described.

In any event, this 8-bit code word is furthermore applied to the inputs A–H of the programmed frequency divider, resulting in establishment of the frequency-division factor N requisite for tuning-in the channel corresponding to the 8-bit code word within the selected one of the four frequency ranges. The programmed divider is set by this command signal and effects the division from the just set number to zero.

As indicated in FIG. 5, branch-off lines 69–76 transmit respective ones of the bits on input lines A–H of the programmed frequency divider to respective ones of the column-control stage 70, the row-control stage 84 and the plus/minus-control stage 77, for controlling the operation of the indicator elements 78 of the main indicator and the elements 79 of the side-channel indicator.

Figure 7:
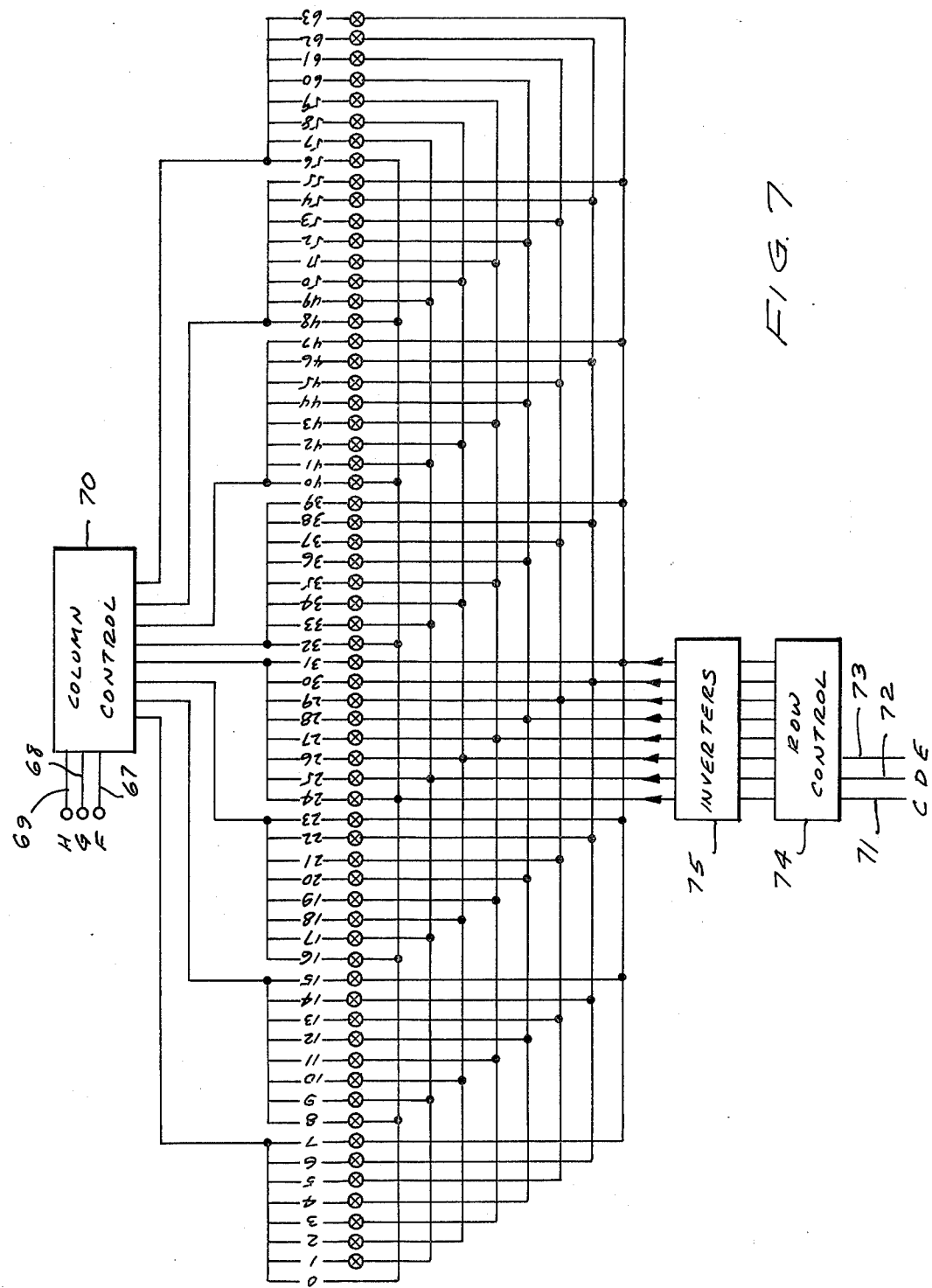
FIG. 7 shows in detail how the light-emitting elements of the indicator are controlled.

FIG. 7 depicts in greater detail how the sixty-four indicator elements of the main indicator are controlled, components in FIG. 7 corresponding to those of FIG. 5 being denoted by the same reference characters and numerals.

Row-control stage 74 is comprised of a BCD octal decoder the eight outputs of which are connected to the inputs of an eight-fold inverter stage 75.

The sixty-four indicator elements are subdivided (in terms of wiring) into eight columns (0–7, 8–15, 16–23, 24–31, 32–39, 40–47, 48–55, 56–63). Within each one of these eight indicator-element columns, the upper terminals of all the indicator elements in the column (e.g., 0–7) are connected in common to a respective one of eight outputs of the column-control stage 70. The sixty-four indicator elements are furthermore subdivided (again, in terms of wiring) into eight rows. The lower terminals of all eight indicator elements within a row are connected, in common, to a respective one of the eight outputs of the 8-fold inverter stage 75; for example, the lower terminals of the indicator elements of the first such row (elements #0, #8, #16, #24, #32, #40, #48, #56) are all connected in common to the leftmost output of inverter stage 75.

In order to cause, for example, indicator element #29 to light up, a command signal must be present on the third output (from the right) of inverter stage 75, and simultaneously therewith, a control signal must be present on the fifth output (from the right) of column-control stage 70. Each of the sixty-four possible combinations of one output of inverter stage 75 with one output of column-control stage 70 is, accordingly, associated with a single respective one of the sixty-four indicator elements.

Figure 8:
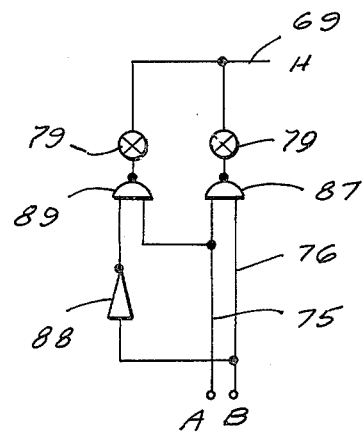
FIG. 8 illustrates how the side channel indication is accomplished.

FIG. 8 depicts the manner in which the plus/minus-control stage 77 of FIG. 5 operates. The branch-off lines 75, 76 (branching off input lines A, B of programmed frequency divider 55) receive signals, as already explained, indicating whether a main channel, a left side channel or a right side channel is tuned in. Line 76 is connected to one input of a NAND-gate 87 and also to the input of an inverter 88. Line 75 is connected to the second input of NAND-gate 87 and to a first input of a second NAND-gate 89. The second input of NAND-gate 89 is connected to the output of inverter 88.

Whenever the 8-bit channel-identifying code word identifies a "+" channel (i.e., a right side channel) a signal is present at the output of NAND-gate 87. Whenever the 8-bit channel-identifying code word identifies a "−" (i.e., a left side channel) a signal is present on the output of NAND-gate 89.

The signals furnished at the outputs of NAND-gates 87, 89 are applied to small lamps 79 and cause one or the other to light up, provided that simultaneously therewith the other terminal of the respective lamp 79 receives a control signal, these other terminals being connected in common to the H input line of the divider, through the intermediary of the branch-off line 69 leading to the column-control stage 70.

Figure 9:
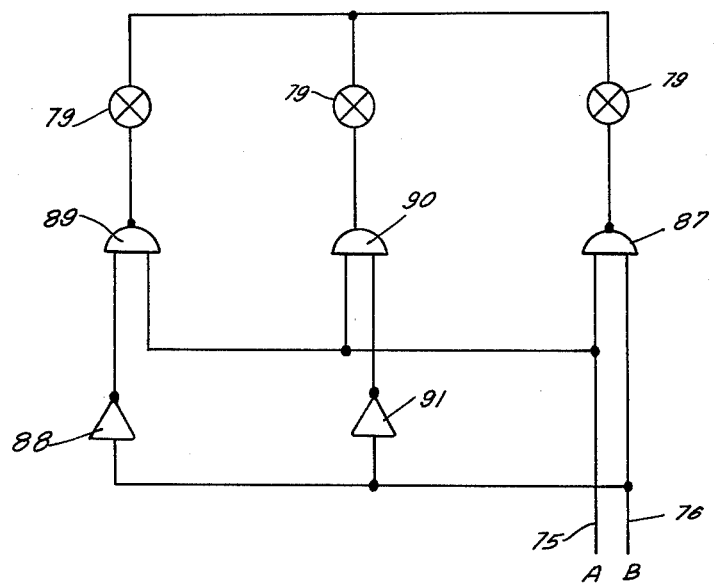
FIG. 9 illustrates a modification of FIG. 8 according to which a third indicator element 79 is provided to expressly indicate, not only left and right side channels, but the intermediate main channel as well.

In FIG. 9, a further indicating element 79 is provided with an AND-gate 90 and an inverter 91, this middle indicating element 79 accordingly lighting up when a main channel has been tuned in.

In the illustrated embodiment, as shown particularly clearly in FIG. 5, the indicating elements 78 of the main indicator (and also the elements 79 of the left/right side-channel indicator) are controlled in dependence upon the operation of the multi-channel oscillator (45-47, 50, 53-66). It is preferred that the multi-channel oscillator (45-47, 50, 53-66) be, as illustrated herein, a digitally controlled frequency synthesizer, preferably as illustrated of the phase-locked-loop type and including a programmed frequency divider for establishing the requisite local-oscillator frequencies.

It will be understood that each of the elements described above, or two or more together, may also find a useful application in other types of circuits and constructions differing from the types described above.

While the invention has been illustrated and described as embodied in an AM/FM receiver channel indicator adapted for use with four frequency ranges, it is not intended to be limited to the details shown, since various modifications and structural changes may be made without departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. In a radio receiver of the type comprising means for receiving a transmitted high-frequency signal, mixing means for receiving the high-frequency signal and also a local-oscillator-frequency signal and processing the two signals to form an intermediate-frequency signal, and means for converting the intermediate-frequency signal into an audio-frequency signal, the receiver being adapted to receive within a predetermined frequency range a series of main channels spaced apart at predetermined frequency intervals and also left and right side channels, each left side channel being spaced by a predetermined frequency interval below a respective one of the main channels, each right side channel being spaced by a predetermined frequency interval above a respective one of the main channels, in combination therewith, multi-channel oscillator means operative for furnishing the local-oscillator-frequency signals to the mixing means; and quasi-analog digital channel display means operative for indicating which channel has been tuned in using a display technique visually simulating the display performed by mechanical channel display means of the calibrated-scale-with-shifting-pointer type, the quasi-analog digital channel display means including a plurality of indicator elements arranged in a row to form a quasi-analog channel-indicating scale the successive individual indicator elements of which are each respectively associated with a respective successive one of the channel frequencies in the band of broadcast channel frequencies receivable by the radio receiver in the same sequence as the channel frequencies are located within the receivable band of broadcast channel frequencies, and indicator control means controlled by the multi-channel oscillator means and in turn controlling the operation of the indicator elements, and the display means further including two auxiliary indicator elements respectively operative for indicating that a right side channel or a left side channel has been tuned in, the indicator control means comprising means operative in dependence upon the multi-channel oscillator means for causing the indicator element of said row associated with a tuned-in channel to be operative and for causing one or the other of the auxiliary indicator elements to become operative in dependence upon whether the multi-channel oscillator means has effected the tuning-in of a left side channel or a right side channel.

2. In a radio receiver of the type comprising means for receiving a transmitted high-frequency signal, mixing means for receiving the high-frequency signal and also a local-oscillator-frequency signal and processing the two signals to form an intermediate-frequency signal, and means for converting the intermediate-frequency signal into an audio-frequency signal, the receiver being adapted to receive within a predetermined frequency range a series of main channels spaced apart at predetermined frequency intervals and also left and right side channels, each left side channel being spaced by a predetermined frequency interval below a respective one of the main channels, each right side channel being spaced by a predetermined frequency interval above a respective one of the main channels, in combination therewith, multi-channel oscillator means operative for furnishing the local-oscillator-frequency signals to the mixing means; and quasi-analog digital channel display means operative for indicating which channel has been tuned in using a display technique visually simulating the display performed by mechanical channel display means of the calibrated-scale-with-shiftingpointer type, the quasi-analog digital channel display means including a plurality of indicator elements arranged in a row to form a quasi-analog channel-indicating scale the successive individual indicator elements of which are each respectively associated with a respective successive one of the channel frequencies in the band of broadcast channel frequencies receivable by the radio receiver in the same sequence as the channel frequencies are located within the receivable band of broadcast channel frequencies, and indicator control means controlled by the multi-channel oscillator means and in turn controlling the operation of the indicator elements and the display means further including three auxiliary indicator elements respectively operative for indicating that a main channel, a right side channel or a left side channel has been tuned in, the indicator control means comprising means operative in dependence upon the multi-channel oscillator means for causing the indicator element of said row associated with a tuned-in channel to be operative and for causing a first, a second or a third of said auxiliary indicator elements to become operative in dependence upon whether the multi-channel oscillator means has effected the tuning-in of a main channel, a left side channel or a right side channel.

3. In a radio receiver as defined in claim 2, the means operative in dependence upon the multi-channel oscillator means for causing the indicator element of said row associated with a tuned-in channel to be operative being means causing only the one indicator element of said row associated with the tuned-in channel to be operative.

* * * * *